United States Patent
Bracchitta et al.

(10) Patent No.: US 6,373,095 B1
(45) Date of Patent: *Apr. 16, 2002

(54) NVRAM CELL HAVING INCREASED COUPLING RATIO BETWEEN A CONTROL GATE AND FLOATING GATE WITHOUT AN INCREASE IN CELL AREA

(75) Inventors: John A. Bracchitta, South Burlington; James S. Nakos, Essex, both of VT (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/030,094

(22) Filed: Feb. 25, 1998

(51) Int. Cl.[7] .............................................. H01L 29/788
(52) U.S. Cl. ....................................... 257/316; 257/315
(58) Field of Search ................................ 257/314, 315, 257/316, 317, 319, 320, 321; 438/263, 264, 594

(56) References Cited

U.S. PATENT DOCUMENTS

| | | | | |
|---|---|---|---|---|
| 4,703,456 A | | 10/1987 | Arakawa | 365/185 |
| 4,757,360 A | * | 7/1988 | Faraone | 365/185.29 |
| 5,089,867 A | * | 2/1992 | Lee | 257/316 |
| 5,111,270 A | * | 5/1992 | Tzeng | 257/317 |
| 5,315,142 A | | 5/1994 | Acovic et al. | 257/316 |
| 5,345,417 A | | 9/1994 | Crotti | 365/185 |
| 5,380,672 A | | 1/1995 | Yuan et al. | 437/43 |
| 5,382,540 A | | 1/1995 | Sharma et al. | 437/43 |
| 5,465,249 A | | 11/1995 | Cooper, Jr. et al. | 365/149 |
| 5,523,970 A | | 6/1996 | Riggio, Jr. | 365/185.01 |
| 5,563,083 A | | 10/1996 | Pein | 437/43 |
| 5,677,216 A | * | 10/1997 | Tseng | 437/43 |
| 5,877,980 A | * | 3/1999 | Mang et al. | 365/185.17 |
| 5,915,177 A | * | 6/1999 | Tseng | 438/264 |

FOREIGN PATENT DOCUMENTS

| | | | | |
|---|---|---|---|---|
| JP | 63-131582 | | 6/1988 | |
| JP | 03-034578 | | 2/1991 | |
| JP | 03034581 | * | 2/1991 | H01L/29/788 |
| JP | 11074380 | * | 3/1999 | H01L/21/8247 |

* cited by examiner

*Primary Examiner*—Tom Thomas
*Assistant Examiner*—Shouxiang Hu
(74) *Attorney, Agent, or Firm*—Connolly Bove Lodge & Hutz LLP; Mark Chadurjian

(57) ABSTRACT

A field effect floating gate transistor forming an NVRAM cell is disclosed. A substrate having field isolation structures includes therebetween a doped region forming a channel connecting a source and drain. An oxide layer is disposed over said channel forming a tunneling oxide layer for the device. A layer of polysilicon extends over the oxide layer, to each of the isolation structures and then extends upwards forming a U-shaped pillar floating gate. A second oxide layer disposed within the interior of the U-shaped floating gate supports a control gate. A second layer of polysilicon formed over the second oxide layer forms a control gate, and is connected to a conductor which is common to a row of such cells within a memory. The control gate is coupled to the floating gate through the second oxide layer to the upwardly extending layer of the floating gate as well as over the portion of the floating gate extending over the channel.

8 Claims, 4 Drawing Sheets

NVRAM CELL HAVING INCREASED COUPLING RATIO BETWEEN A CONTROL GATE AND FLOATING GATE WITHOUT AN INCREASE IN CELL AREA

BACKGROUND OF THE INVENTION

The present invention relates to nonvolatile memories that use a floating gate transistor as a single bit memory device. Specifically, an NVRAM memory cell is described having increased coupling between the floating gate and control gate without a significant increase in cell area.

Nonvolatile memories are used in digital computing devices for the storage of data. The nonvolatile memory is typically a semiconductor memory comprising thousands of individual transistors configured on a substrate to form a matrix of rows and columns of memory cells. The semiconductor memories have relatively fast access times and provide a high data storage density. The physical size of the nonvolatile memory arrays limits the data storage capacity for the memory.

In one type of nonvolatile memory, floating gate transistors are used as the memory device. The potential on the control gate is coupled to the floating gate to program the charge stored on the floating gate. The devices are programmed by injecting a charge onto the floating gate dielectric by means of tunneling or hot electron injection. The presence or absence of stored charge determines a conduction state for the transistor which in turn represents a logic state. The floating gate transistors are used to implement erasable programmable read only memories where the injected charge is nonvolatily stored for long periods of time even after the power has been turned off to the memory. Erasure of the data is effected by a potential which is applied to a control gate of the floating gate transistor.

In the conventional architecture of E-PROM cell arrays, each column of floating gate transistors have the drain contacts of the transistors connected together, and the transistors of each column have their control gate lines connected together. The sources of floating gate transistors in the same column are electrically connected in common, and are also connected to an adjacent column for a flash type architecture. The individual transistors of the matrix are formed in a common silicon substrate, and transistors arranged in the same row are separated by a field isolation structure from transistors in a subsequent row.

The coupling between the control gate and floating gate is proportional to the amount of common area separating the floating gate from the control gate. In a conventional CMOS NVRAM cell structure, the floating gate is extended over a thick oxide dielectric to increase the coupling ratio of the control gate to the floating gate. The thickness of the oxide is optimized for reliability and a minimization of defects, as well as for optimum coupling. These objectives directly control the cell area, thereby affecting the storage density of the memory array. Thus, in order to increase the storage density and obtain the corresponding increase in data density per unit area, it is desirable to increase the coupling ratio of the floating gate to the control gate of an individual cell transistor, without increasing the corresponding size of the transistor.

Attempts at increasing the coupling between the control gate and floating gate of an NVRAM cell are disclosed in U.S. Pat. Nos. 5,315,142 and 5,380,672. The memory cells of these devices are formed in a three-dimensional trench structure in the silicon substrate, and have a floating gate structure which is coupled to a control gate over essentially three surfaces. Placing the floating gate within the trench provides an opportunity to locate a control gate along the inside vertical upstanding walls of the floating gate, as well as the portion of the floating gate which resides in the bottom of the trench. The floating gate is charged and discharged due to tunneling of electrons in the vertical sidewalls which incorporate source and drain regions, and the floating gate. The trench memory cell structures occupy only a small amount of surface area while maintaining a high coupling ratio between the control gate and the floating gate.

The present invention represents a further attempt to increase coupling between the control gate and the floating gate without the use of trench architecture, and without a significant increase in cell area.

SUMMARY OF THE INVENTION

It is an object of this invention to increase the coupling ratio between a control gate and floating gate of an NVRAM memory cell.

It is a further object of this invention to increase the coupling ratio between a control gate and floating gate of a transistor without increasing the cell area.

These and other objects of the invention are provided for by a transistor, and a method for manufacturing the same, in accordance with the invention. The invention provides an NVRAM cell having a floating gate which is disposed over a channel extending between a source and drain region of a thin film field effect transistor. The floating gate is insulated from the source and drain regions by a tunneling oxide, and is U-shaped having two vertically extending sidewalls. A second insulation layer, such as oxide nitride oxide (ONO) layer is disposed within the U-shaped interior of the floating gate, and over the top and exterior surface of the vertically extending sides. A second layer of polysilicon forms a control gate for all of the cells in the same column. The second polysilicon layer conforms to the floating gate interior over the oxide nitride oxide layer and over the top and exterior surfaces of the insulated sidewalls.

The exterior surface of the vertical sidewalls of the floating gate structure, as well as the interior surface of the floating gate are capacitively coupled to the control gate through the ONO layer. The total surface area between control gate and floating gate is increased by virtue of the outside surface area of the vertically extending sidewalls of the floating gate and the interior vertical sidewalls of the control gate, thereby increasing the coupling ratio without suffering an increase in substrate surface area for the device.

DESCRIPTION OF THE PREFERRED EMBODIMENT

Figure 1:
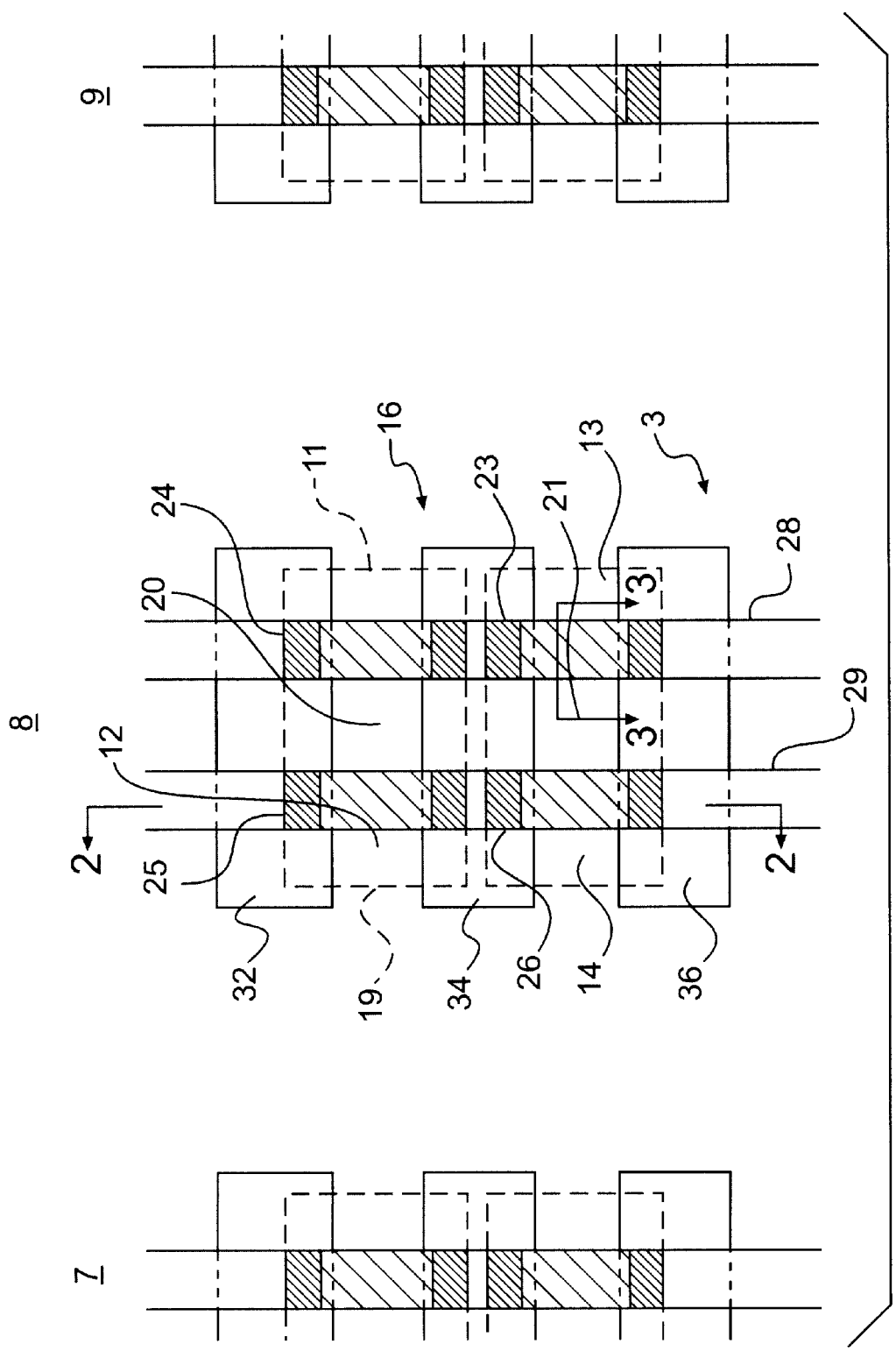
FIG. 1 is a top view showing a nonvolatile memory having memory cells in accordance with a preferred embodiment of the invention.

Referring now to FIG. 1, there are shown portions 7–9 of a non-volatile memory comprising a plurality of NVRAM memory cells. Portion 8 of the non-volatile memory includes NVRAM cells 11–14. The NVRAM cells 11–14 are formed in a matrix of two columns, and two rows of memory cells. The two memory cells of a row share a common connection to drain regions 20 and 21, and the columns of memory cells have source regions 16 and 19 which are common to the adjacent column in portions 7 and 9. The drain and source regions are doped regions in a polysilicon substrate 3. The two drain regions 20, 21 are in turn connected together by a conductor (not shown) with other drain regions of the remaining memory cells of a row.

Each of the memory cells also includes a floating gate structure 23–26 separating the source 16, 19 and drain 20, 21 regions of a respective NVRAM cell. Conduction between the respective source 16, 19 and drain regions 20, 21 is controlled by an electric field produced by the respective floating gates 23–26. Control gates 28, 29 are shown overlapping floating gates 23, 24 and 25, 26 of a respective of NVRAM cells.

Figure 2:
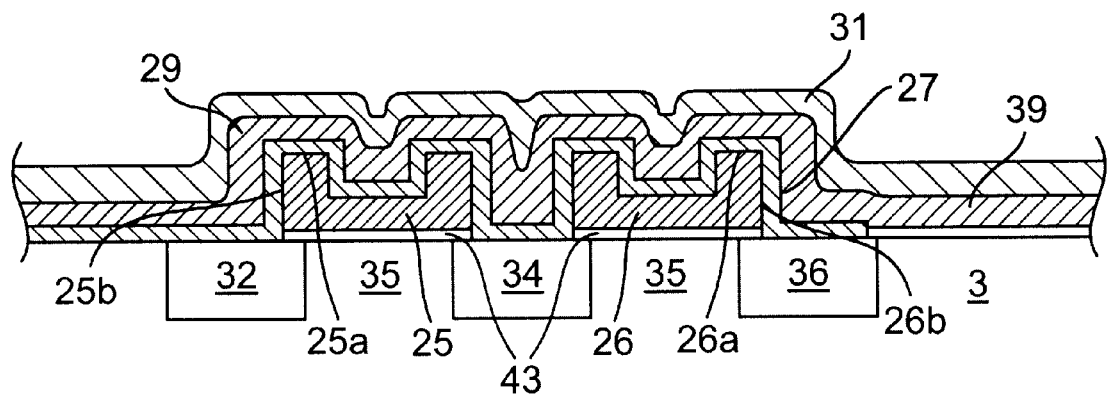
FIG. 2 is a section view of a pair of the NVRAM memory cells taken along lines 2—2 of FIG. 1.

The structure of the control gates 28, 29 and floating gates 25 and 26 are shown more particularly in FIG. 2 which represents a section view taken along line 2—2 of FIG. 1. Each of the two floating gates 25 and 26 comprises a layer of polysilicon having a U-shaped cross section. The floating gates 25, 26 have a pair of vertically extending sides forming sidewalls 25(b) and 26(b) at the edge of the underlying conduction channels 35. The polysilicon floating gates 25, 26 are covered with a layer of oxygen-nitride-oxygen (ONO) 27 for separating the control gate 29, also of polysilicon, from the floating gates 25 and 26. A hard mask conformal coating 31 covers the control gate.

The floating gates 25 and 26 are separated from the doped channel regions 35 by a thin tunnel oxide layer 43 of approximately 9 nm. When the control gates 28, 29 are at a positive potential with respect to the sources 16, 19, a charge is injected under the floating gates 25, 26, and stored there representing a logic state of the memory cells. The doped regions 35 comprise a channel for the NVRAM cell which terminates on a respective source or drain of the cell. Conduction between the source and drain regions is controlled by the charge stored on the floating gate 25–26.

The generally U-shaped floating gate structures 25 and 26 are capacitively coupled via the ONO layer 27 to control gate 29 which has an M-shaped structure. The coupling between the control gate 29 and the floating gates 25, 26 viz-a-viz ONO insulation layer 27 occurs along the top 25(a), 26(a) of the U-shaped portion of the floating gates 25 and 26, and along the exterior sides thereof of vertically extending sidewalls 25(b), 26(b), i.e., wherever the control gate 29 and floating gates 25 and 26 are separated by the ONO layer 27. Thus, increased coupling is available due to the U-shaped floating gates 25 and 26 and M-shaped control gate layer 29.

The doped silicon areas 35 of the individual NVRAM cells are separated by STI isolation structures 32, 34, and 36 formed in the silicon substrate 3 which isolate rows of NVRAM cells.

Figure 3:
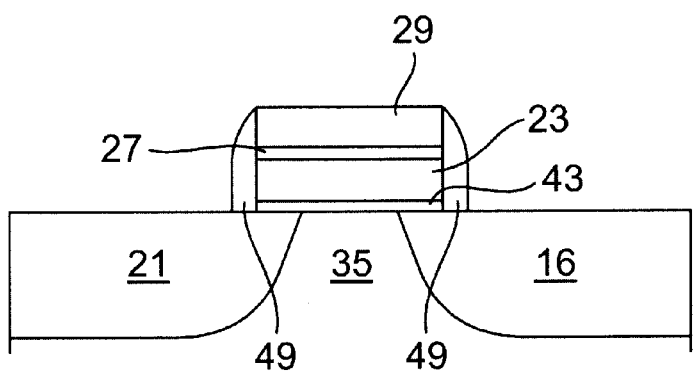
FIG. 3 is a section view of an NVRAM memory cell taken along lines 3—3 of FIG. 1.

FIG. 3 is a section view taken along the section B—B of FIG. 1. Control gate 29 is shown separated from the floating gate 25 by the ONO insulation layer 27. Nitride spacers 49 are formed during a deposition and etch process along each side. The drain and source regions 16, 21 are separated by channel regions 35, as is known in the semiconductor art, whose conduction is controlled from the charge stored on the floating gate 25. The floating gates 25, 26 have a longitudinal axis which is generally perpendicular to the flow of current through the conduction channels 35 between the source 20, 21 and drain regions 16, 19.

The increased coupling provided by the M-shaped control gate 29 disposed within the U-shaped interior of the floating gates 25 and 26, as well as that portion overlapping the top 25(a), 26(a) and vertical sidewalls 25(b), 26(b) of the U-shaped floating gates 25 and 26 increases the coupling of the floating gate to the control gate, without increasing the corresponding size of each NVRAM cell. The increase in coupling due to the increase in common area separating the floating gates 25 and 26 from the control gate 29 occurs without any material increase in the area occupied on the substrate 3, thereby avoiding any loss in storage density for the memory array.

Figure 4:
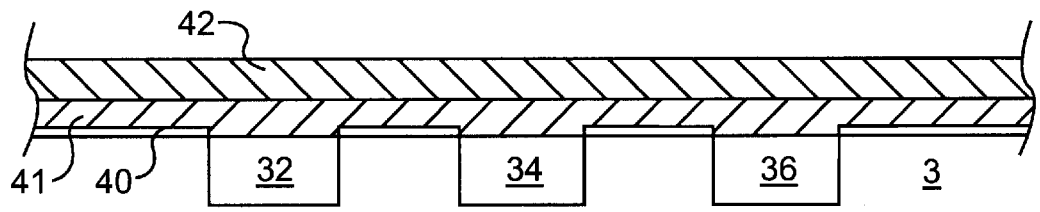
FIG. 4 is a first process step for forming a floating gate structure for each NVRAM cell.
Figure 5:
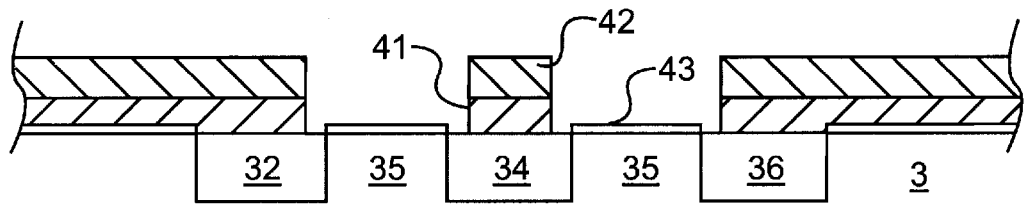
FIG. 5 illustrates a process step for creating pillars for forming a floating gate for each NVRAM cell.

A process for manufacturing the NVRAM cells of the memory array is illustrated in FIGS. 4–12. FIG. 4 illustrates the semiconductor substrate 3 having various field isolation structures 32, 34 . . . 36 which form boundaries between rows of adjacent NVRAM cells viewed along section lines B—B of FIG. 1. Three layers of semiconductor material are deposited above the surface of the semiconductor substrate 3. The first is a silicon dioxide $SiO_2$ insulation layer 40 between each of the field isolation structures 32, 34 and 36. The silicon dioxide layer 40 is approximately 15 nm in height and is limited to the regions between the field isolation structures 32–36. A layer of nitride 41 is deposited above the field isolation structures 32 and 36 and silicon dioxide 40 to a height of approximately 80 nm. A layer of PSG (phosphorous silica glass) 42 is then deposited to a height of approximately 500 nm above the nitride layer 41. The layered structure of FIG. 4 is patterned, and the PSG 42 and nitride 41 layers and silicon dioxide layer 40 are etched away in the spaces between the field isolation structures 32, 34 and 36 as illustrated in FIG. 5, leaving two pillars which define the location of two vertical sidewalls for the floating gates 25, 26. A tunnel oxide 43 is regrown to a depth of 9 nm in those portions between the field isolation structures 32–36 above the silicon 35 which will form the conduction channels of the NVRAM cells.

Figure 6:
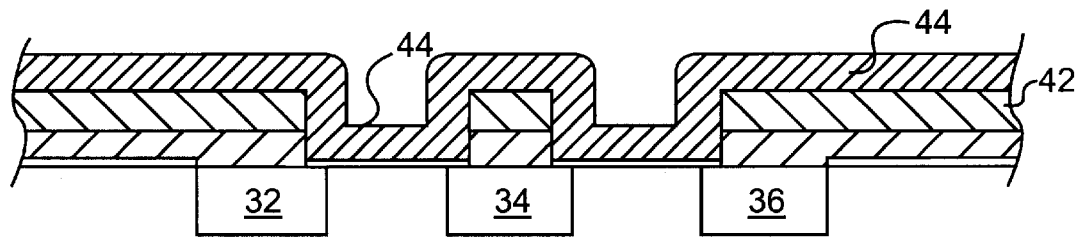
FIG. 6 illustrates a process step for creating a floating gate over the channel regions of the silicon substrate.

Referring now to FIG. 6, the initial step for forming the floating gates 25 and 26 is shown. A layer of polysilicon 44 is deposited over the entire structure to a height of 100 to 300 nm, and preferably at 200 nm. The polysilicon layer 44 is polished to remove any portion extending above the PSG layer 42 as shown in FIG. 7 so that polysilicon layer 44 only occupies the floating gate space above the NVRAM cell channel areas 35, separated therefrom by tunnel oxide layer 43.

Figure 7:
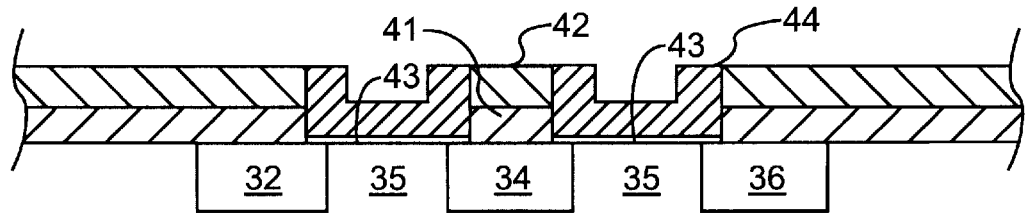
FIG. 7 illustrates the removal of the polysilicon deposition of FIG. 6 in selected areas.
Figure 8:
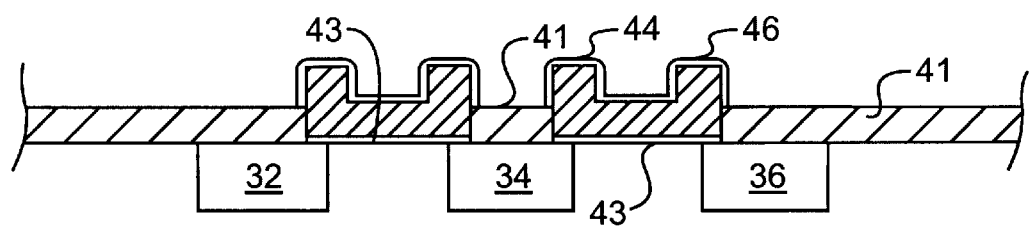
FIG. 8 illustrates the formation of vertical upstanding sidewalls for the floating gates 25 and 26.
Figure 9:
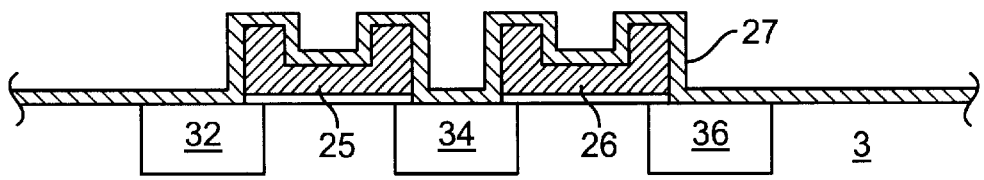
FIG. 9 shows a ONO deposition step for creating an insulation layer for the floating gate.

FIG. 8 illustrates the process of removal of the PSG layer 42 of FIG. 7 from the surface of nitride layer 41 using a suitable mask creating two sidewalls for the floating gates 25, 26. An additional oxidation layer 46 of a height approximately 5–9 nm is then formed over the floating gate structure. The nitride layer 41 of FIG. 8 is etched away until the silicon substrate 3 is reached. The thin oxide layer 46 which was deposited in FIG. 8 is subsequently removed in a dip-off process before depositing ONO layer 27 over the remaining structures. FIG. 9 illustrates the steps of forming the oxide-nitride-oxide (ONO) layer 27, having a height of between 5 and 30 nm, which separates the floating gate 25 and 26 from the control gate 29. The ONO layer 27 is created from a known process of oxidizing the surface layer and depositing a nitride layer, followed by an oxidation step so that the oxidation-to-nitride ratio of the ONO layer 27 may be approximately 50:50.

Figure 10:
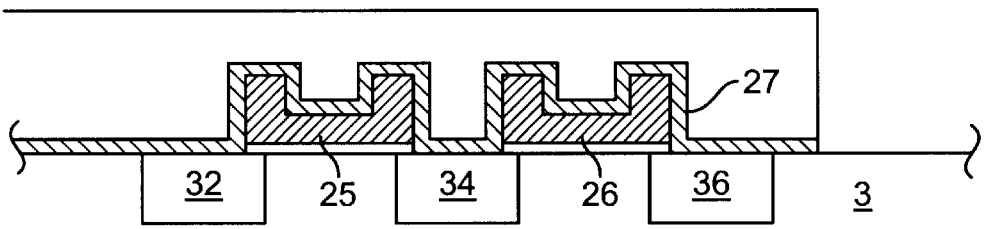
FIG. 10 illustrates a masking step for removing the ONO layer in regions of the semiconductor outside the memory cells.

FIG. 10 shows a masking step which is used to remove ONO layer 27 from adjacent areas of the silicon substrate 3 which are used for circuit components other than the NVRAM cells. In this way, the ONO layer 27 is confined to the NVRAM structures.

Figure 11:
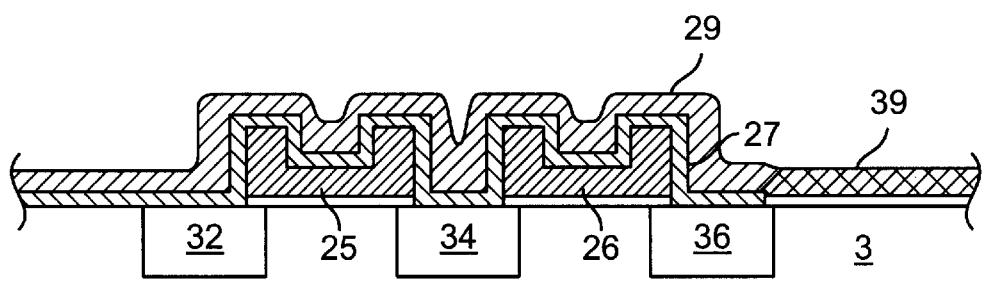
FIG. 11 illustrates the deposition of polysilicon to create control gates for the NVRAM cells.

In accordance with FIG. 11, a layer of oxidation 39 of approximately 20 nm is created in the region outside of the NVRAM cells which is used in creating the non-NVRAM circuit components on the substrate 3. A control gate layer 29 of polysilicon is then deposited over the ONO layer 27. The control gate layer 29 is separated from the floating gate by the ONO layer 27 along the inside of the U-shaped floating gate, along the tops of the sidewalls 25(a), 26(a) and on the exterior surface of the sidewalls 25(b), 26(b).

Figure 12:
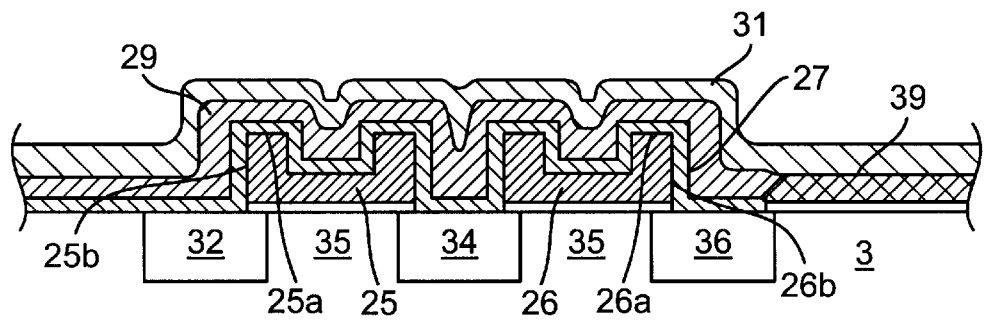
FIG. 12 shows a process step for creating an hard mask which defines the areas which are to remain in a final etching operation.

FIG. 12 illustrates a step of adding a hard mask layer 31 to the control gate polysilicon layer 29. The hard mask layer 31 may be composed of an oxide or nitride layer. The hard mask layer is used as an image transfer film, which defines for subsequent process steps the areas which are to be removed. A subsequent etching step removes all of the remaining layers of polysilicon, ONO, oxide between the control gates, not protected by the hard mask, leaving only the tunneling oxide layer 43 over the silicon substrate 3.

The sidewalls of the control gates 28, 29 which are formed from this etching step are then oxidized and the nitride spacers 49 (shown in FIG. 3) are deposited over the sidewalls.

The completion of the floating gate and control gate structures is followed by the creation of the source and drain diffusion regions on either side of the control gate and floating gate structures. Implementation of N type dopant impurities are effected, with the conventional heat cycle processing used in NVRAM fabrication techniques.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An NVRAM cell having increased coupling between a control gate and a floating gate comprising:
   a substrate having two field isolation structures for separating a transistor from an adjacent transistor;
   a region between said isolation structures forming a conduction channel connecting a source and a drain;
   an oxide layer disposed over said conduction channel;
   a layer of polysilicon extending over said oxide layer to each of said isolation structures, and thence extending upwards forming a pair of vertically extending sidewalls parallel to the length of said conduction channel forming a u-shaped floating gate in the form of a channel open at two ends thereof;
   a second oxide layer disposed within the interior of said u-shaped floating gate, and along the exterior surface of said u-shaped floating gate sidewalls; and
   a second layer of polysilicon formed over said second oxide layer, which forms a control gate which is coupled to said floating gate exterior sidewall surface and said interior of said u-shaped floating gate through said second oxide layer.

2. The NVRAM cell of claim 1 wherein said second layer of polysilicon forms a control gate for a column of NVRAM cells.

3. The NVRAM cell of claim 2 further comprising nitride spacers on each side of said control gate.

4. The NVRAM cell of claim 1 wherein said second oxide layer comprises an oxide nitride oxide composition.

5. The NVRAM cell of claim 1 further comprising a hard mask deposited over said control gate.

6. An NVRAM cell comprising:
   a silicon substrate including a plurality field isolation structures; a pair of which isolate a conduction channel on said substrate;
   a tunneling oxide layer extending over said conduction channel;
   a floating gate located over each of said conduction channels between source and drain regions of said channel, comprising a layer of polysilicon extending across said channel, and forming a pair of sidewalls parallel to the edges of said channel which vertically extend above said channel and parallel to said channel forming a u-shaped channel open on two ends thereof;
   an oxide layer covering an exterior surface of said sidewalls; and
   a control gate capacitively coupled through said oxide layer to said vertically extending sidewalls of said floating gate for applying an electrostatic charge to said floating fate which controls the conduction through said conduction channel.

7. The NVRAM cell according to claim 6 wherein a portion of said floating gate extending across said channel between said sidewalls is covered by said oxide layer and said control gate.

8. The NVRAM cell according to claim 7 wherein said portion extends perpendicular to an axis of conduction through said conduction channel and terminates at said first and second sidewalls.

* * * * *